(12) United States Patent
Morohashi et al.

(10) Patent No.: US 9,373,532 B2
(45) Date of Patent: Jun. 21, 2016

(54) GUIDE APPARATUS, EXPOSURE APPARATUS, AND METHOD OF MANUFACTURING ARTICLE

(71) Applicant: CANON KABUSHIKI KAISHA, Tokyo (JP)

(72) Inventors: Akira Morohashi, Utsunomiya (JP); Nobushige Korenaga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 262 days.

(21) Appl. No.: 13/798,900

(22) Filed: Mar. 13, 2013

(65) Prior Publication Data

US 2013/0273477 A1    Oct. 17, 2013

(30) Foreign Application Priority Data

Apr. 16, 2012   (JP) .................................. 2012-093397

(51) Int. Cl.
  *G03B 27/58* (2006.01)
  *H01L 21/677* (2006.01)
  *F16M 11/20* (2006.01)
  *G03F 7/20* (2006.01)

(52) U.S. Cl.
  CPC ..... *H01L 21/67742* (2013.01); *F16M 11/2092* (2013.01); *G03F 7/70716* (2013.01)

(58) Field of Classification Search
  CPC ...... F16C 29/04; F16C 29/123; F16C 29/002; F16C 2370/00; G03F 7/70816; G03F 7/2014
  See application file for complete search history.

(56) References Cited

U.S. PATENT DOCUMENTS

| 5,477,304 | A   | * | 12/1995 | Nishi ............................ 355/53 |
| 6,705,430 | B2  |   | 3/2004  | Michioka et al. |
| 7,030,964 | B2  |   | 4/2006  | Akutsu et al. |
| 8,033,729 | B2  |   | 10/2011 | Michioka et al. |
| 2002/0085192 | A1 | * | 7/2002  | Miura et al. ..................... 355/73 |
| 2002/0145721 | A1 | * | 10/2002 | Korenaga et al. ............... 355/75 |
| 2008/0073982 | A1 | * | 3/2008  | Ono et al. ........................ 310/12 |
| 2009/0148083 | A1 | * | 6/2009  | Michioka et al. ............... 384/15 |
| 2013/0343680 | A1 | * | 12/2013 | Nishiyama ..................... 384/15 |

FOREIGN PATENT DOCUMENTS

| JP | 1037956 A    | 2/1998 |
| JP | 2000227115 A | 8/2000 |
| JP | 2005005393 A | 1/2005 |
| JP | 2011-007324 A | 1/2011 |
| WO | 2006054439 A1 | 5/2006 |

OTHER PUBLICATIONS

Office Action issued in JP2012-093397, mailed Jun. 29, 2015. English translation provided.
Office Action issued in JP2012-093397, mailed Jun. 29, 2015.

* cited by examiner

*Primary Examiner* — Mesfin T Asfaw
(74) *Attorney, Agent, or Firm* — Rossi, Kimms & McDowell LLP

(57) ABSTRACT

The present invention provides a guide apparatus including a guide member located on a base, and a moving member movable along the guide member. The guide apparatus comprising a plurality of plate members each including a portion facing the base and extending from the portion in a direction to separate from the base, wherein the plurality of plate members are located apart from each other in a direction to separate from the moving member.

15 Claims, 5 Drawing Sheets

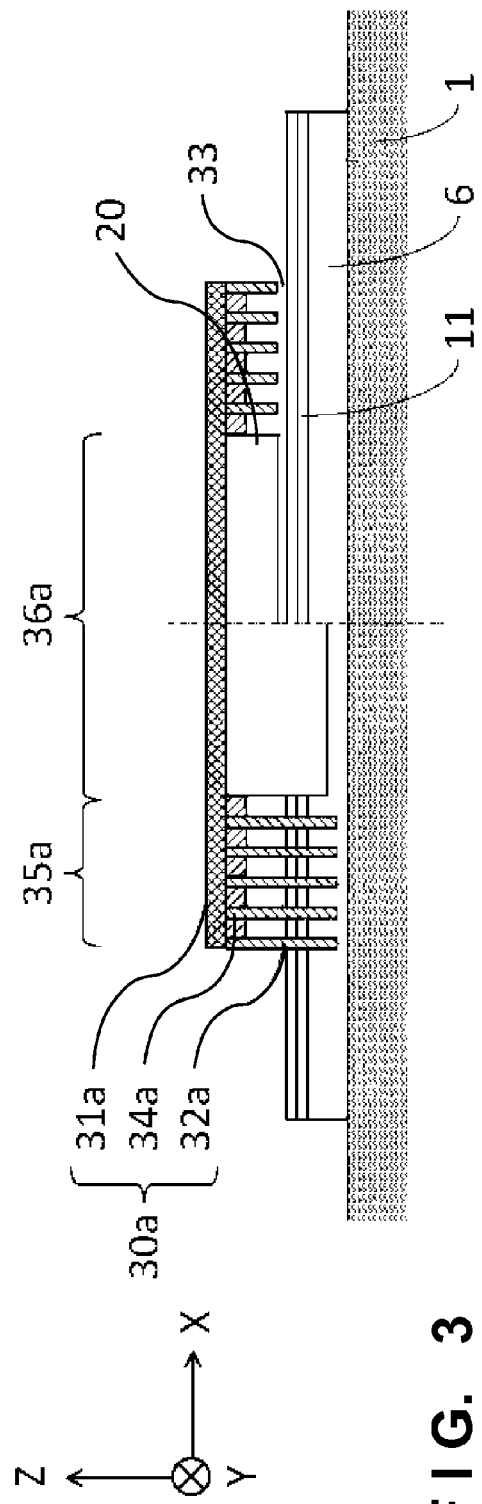
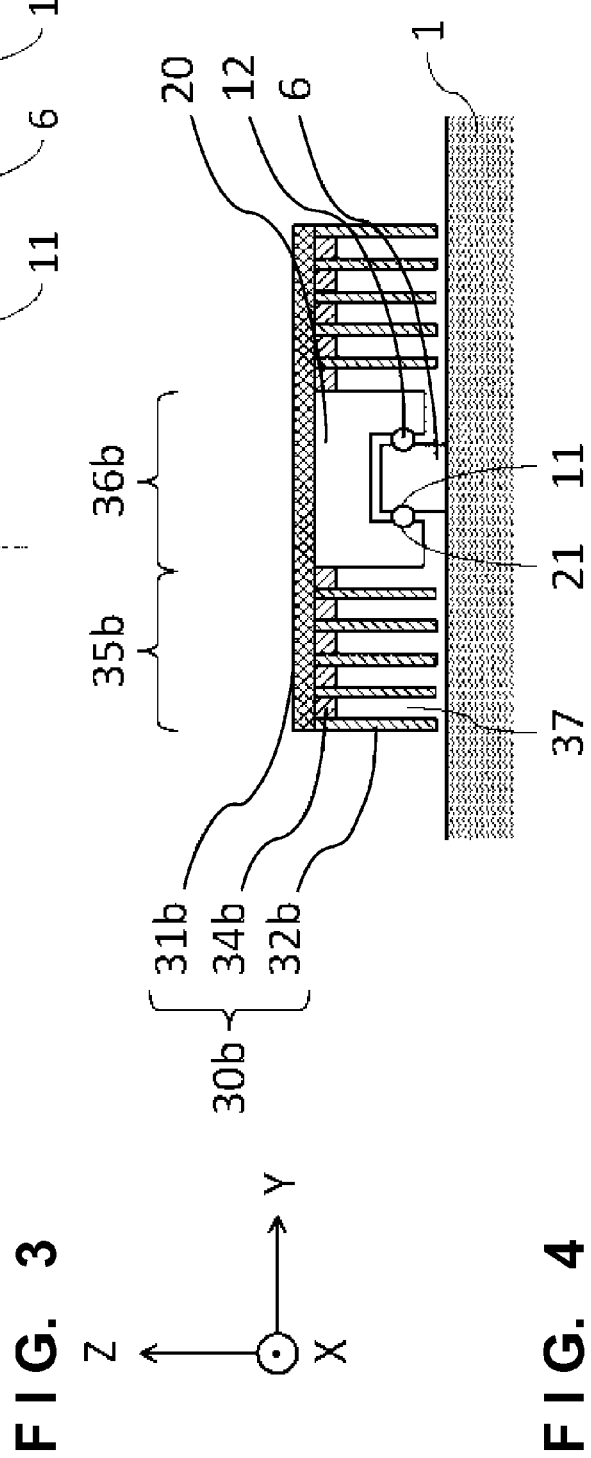

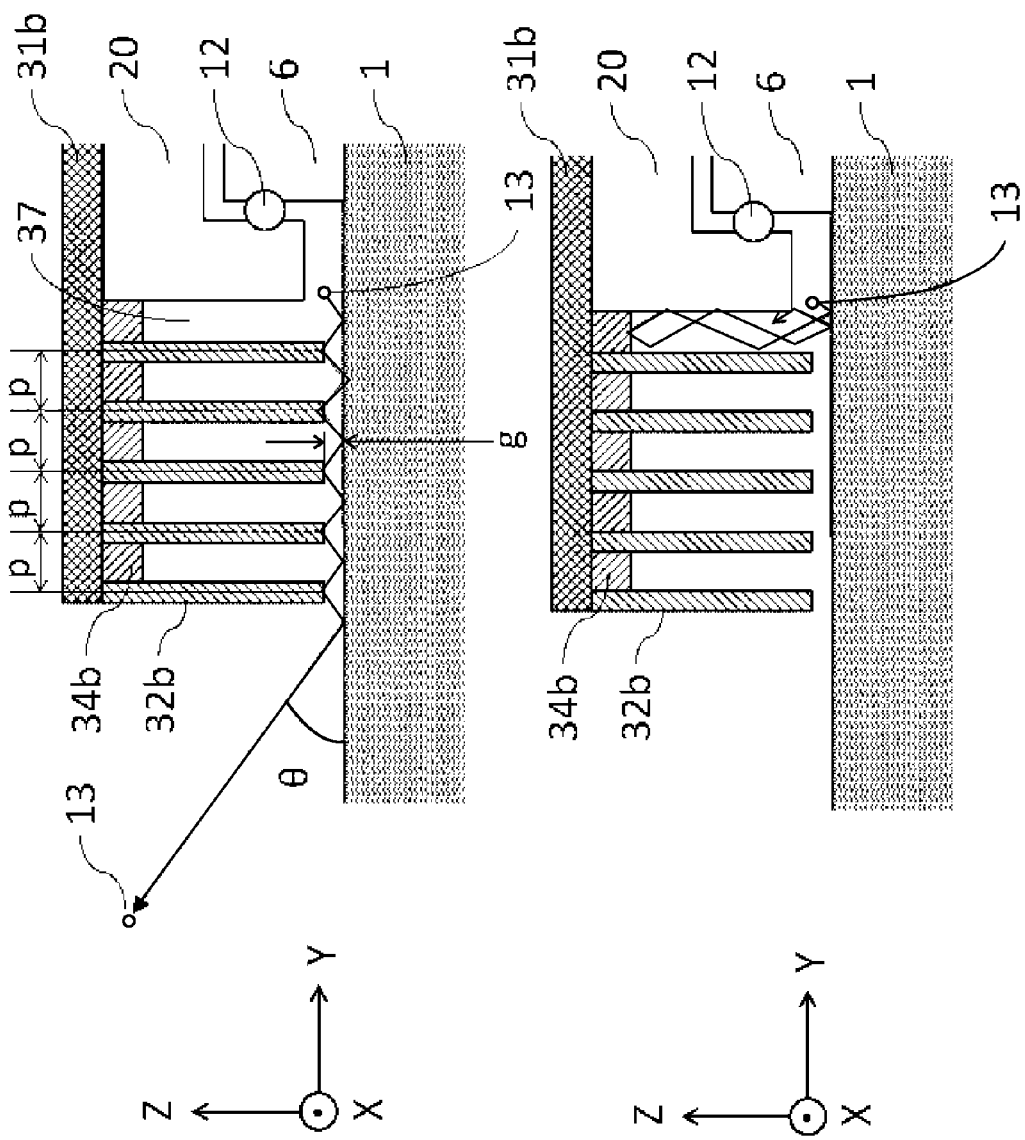

GUIDE APPARATUS, EXPOSURE APPARATUS, AND METHOD OF MANUFACTURING ARTICLE

BACKGROUND OF THE INVENTION

1. Field of the Invention

The present invention relates to a guide apparatus, an exposure apparatus, and a method of manufacturing article.

2. Description of the Related Art

An exposure apparatus used to manufacture a semiconductor device or the like is required to have an accurate microfabrication technique as the microfabrication or integration level of a circuit pattern of a semiconductor integrated circuit rises. Such an exposure apparatus includes a driving apparatus for driving a substrate stage on which a substrate is held. The driving apparatus includes a guide apparatus for guiding the movement of the substrate stage.

The guide apparatus generally includes a guide member supported on a base and provided in parallel to the moving direction of the substrate stage, and a moving member that supports the substrate stage and moves along the guide member. Such a guide apparatus can smoothly move the substrate stage while suppressing its rotation (pitching or yawing) that occurs when the substrate stage moves. In this guide apparatus, however, when the moving member moves, the guide member and the moving member rub against each other, and particles are generated from the rubbing portions. When the generated particles scatter out of the guide apparatus, they adhere to the substrate or pattern, cause pattern defects, yield degradation, and the like, and impede accurate microfabrication in the exposure apparatus. Japanese Patent Laid-Open No. 2011-007324 discloses a technique of preventing the scatter of particles by attaching a cover to the moving-direction end of the moving member.

However, if the cover is simply attached to the moving-direction end of the moving member, the particles generated between the guide member and the moving member continue to fly inside the cover. For this reason, the particles scatter out of the cover from the gap between the cover and the guide member or the base depending on the fly direction of the particles. That is, the related art does not have a sufficient effect of preventing the scatter of particles.

SUMMARY OF THE INVENTION

The present invention provides an advantageous technique for preventing scatter of particles in a guide apparatus.

According to one aspect of the present invention, there is provided a guide apparatus including a guide member located on a base, and a moving member movable along the guide member, comprising: a plurality of plate members each including a portion facing the base and extending from the portion in a direction to separate from the base, wherein the plurality of plate members are located apart from each other in a direction to separate from the moving member.

Further aspects of the present invention will become apparent from the following description of exemplary embodiments with reference to the attached drawings.

BRIEF DESCRIPTION OF THE DRAWINGS

FIG. 3 is a sectional view showing the guide apparatus according to the first embodiment when viewed from a side-surface direction of a guide member;

FIG. 4 is a sectional view showing the guide apparatus according to the first embodiment when viewed from the moving direction of a moving member;

FIG. 5A is a sectional view showing a state in which a particle scatters from a cover unit;

FIG. 5B is a sectional view showing a state in which the particle is trapped by the cover unit.

DESCRIPTION OF THE EMBODIMENTS

Figure 1:
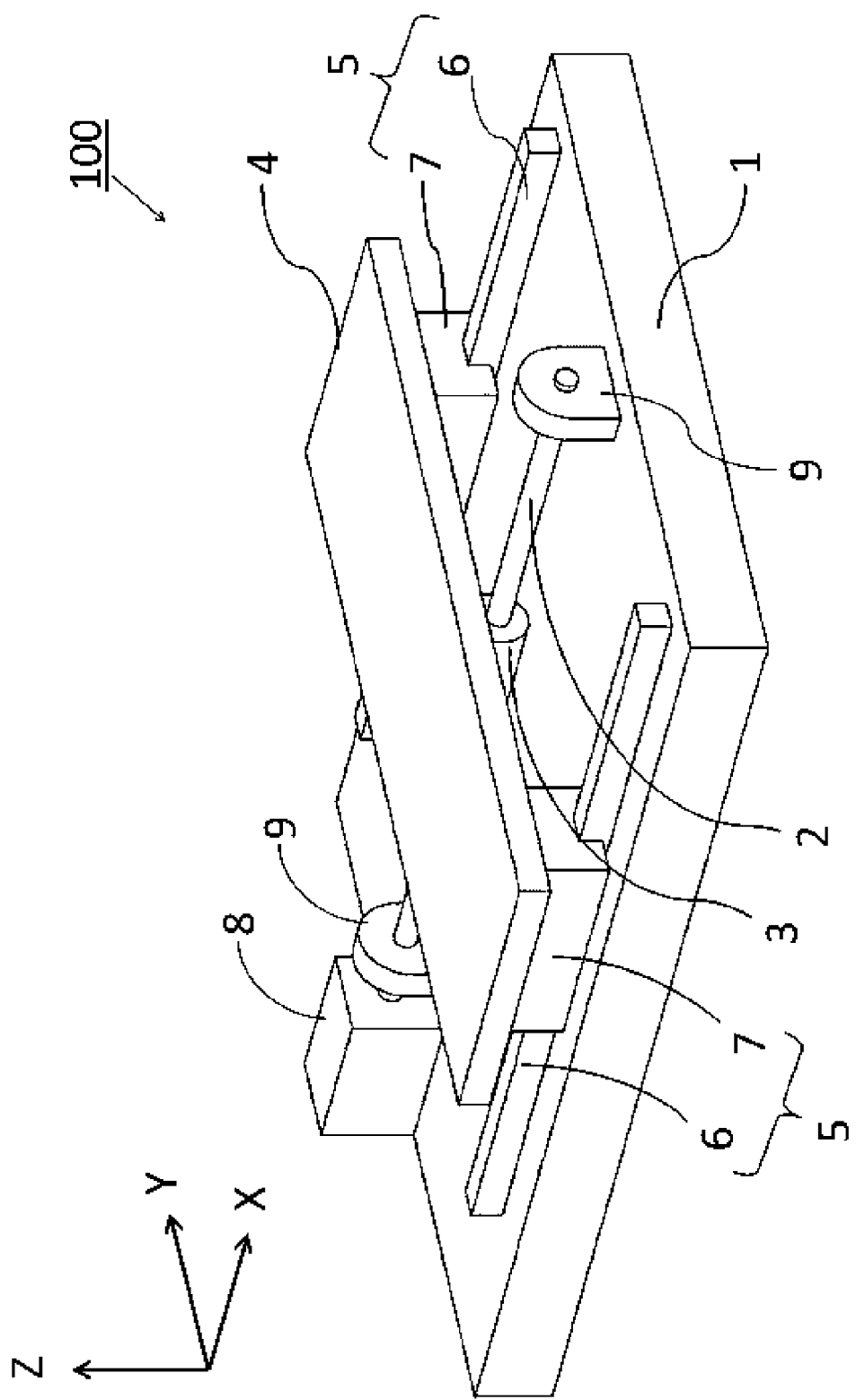
FIG. 1 is a perspective view showing a driving apparatus including a guide apparatus according to the first embodiment of the present invention.

Exemplary embodiments of the present invention will be described below with reference to the accompanying drawings. Note that the same reference numerals denote the same members throughout the drawings, and a repetitive description thereof will not be given.

<First Embodiment>

A guide apparatus 5 according to the first embodiment of the present invention will be described with reference to FIG. 1. FIG. 1 is a perspective view showing a driving apparatus 100 including the guide apparatus 5 according to the first embodiment of the present invention. The driving apparatus 100 includes a base 1, a screw member 2, a nut member 3, and a substrate stage 4. The driving apparatus 100 also includes the guide apparatus 5 that guides the movement of the substrate stage 4, and a motor 8 that rotates the screw member 2.

The screw member 2 is formed into a rod shape. A groove is spirally formed in the side surface of the screw member 2. The screw member 2 is rotatably supported at its two ends by supporters 9 fixed on the base 1. One end of the screw member 2 is connected to the motor 8. For this reason, when a signal is supplied to the motor 8 to drive it, the screw member 2 rotates about the rotation axis.

The nut member 3 is formed into a cylindrical shape and threadedly engages with the screw member 2 that penetrates the center of the nut member 3. A groove having the same interval as that of the groove of the screw member 2 is formed in the inner surface of the nut member 3. Rolling elements are provided between the groove of the nut member 3 and that of the screw member 2. The rolling elements allow the nut member 3 to slide along the rotation axis of the screw member 2 when the screw member 2 rotates. The nut member 3 supports the substrate stage 4. When the nut member 3 slides along the rotation axis of the screw member 2, the substrate stage 4 can be driven in the rotation axis direction of the screw member 2.

The guide apparatus 5 is provided to smoothly move the substrate stage 4 while preventing its rotation (pitching or yawing) that occurs when the substrate stage 4 moves, and is formed from guide members 6 and moving units 7. The guide members 6 have their entire lower surfaces fixed to the base 1 and are located on both sides of the screw member 2 in parallel to its rotation axis direction within the moving range of the substrate stage 4. Grooves 11 configured to move the moving unit 7 along the guide member 6 are formed in the side surfaces of the guide member 6. Rolling elements 12 to be described later are located in the grooves 11 formed in the guide member 6. The moving units 7 support the substrate stage 4 and move along the guide members 6 as the substrate stage 4 moves.

Figure 2:
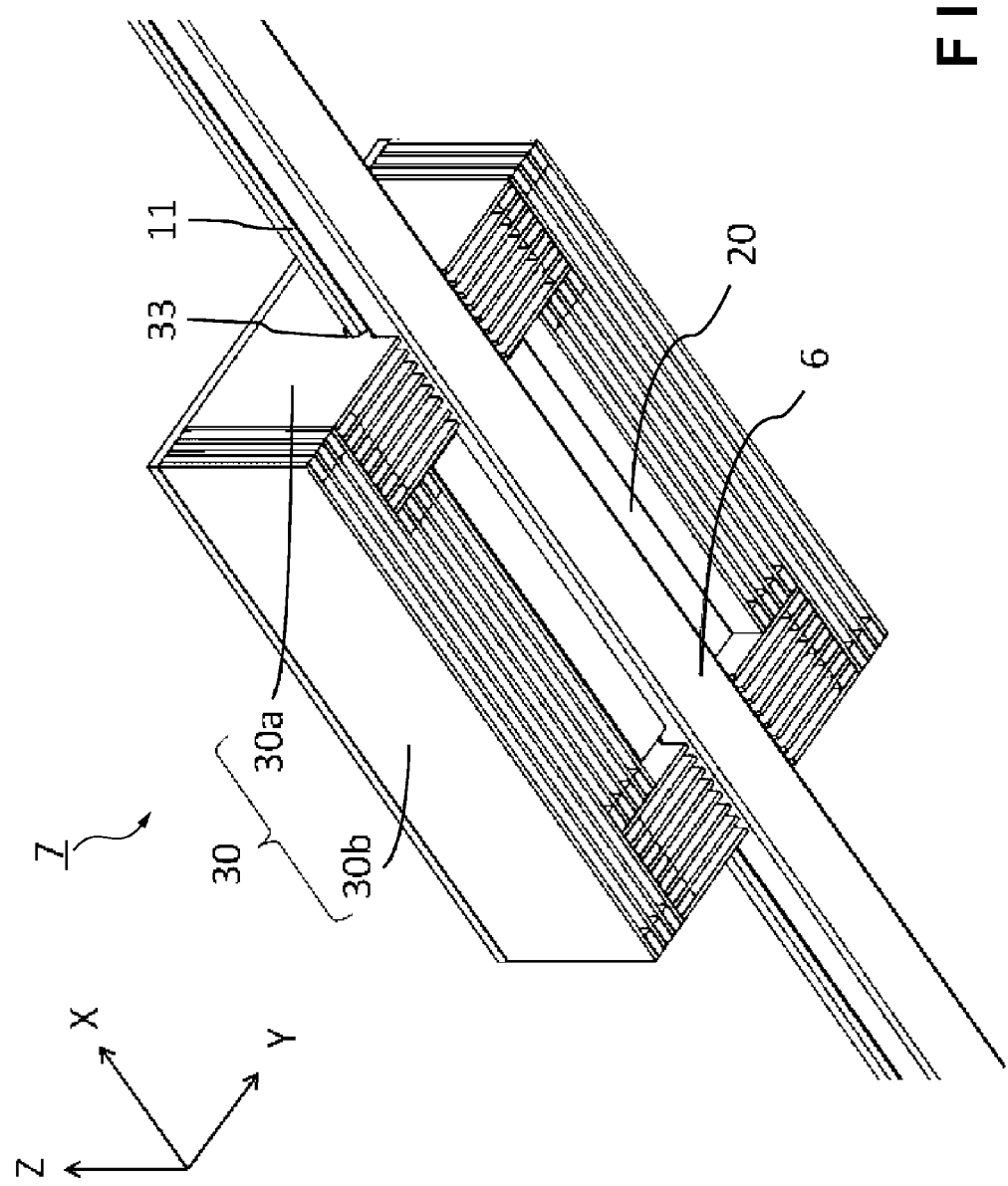
FIG. 2 is a perspective view showing the arrangement of the guide apparatus according to the first embodiment viewed from the lower side.

The moving unit 7 of the guide apparatus 5 according to the first embodiment will be described here with reference to FIG. 2. FIG. 2 is a perspective view showing the arrangement of the moving unit 7 of the guide apparatus 5 according to the first embodiment viewed from the lower side (the base 1 is not illustrated). The moving unit 7 is formed from a moving member 20 and a cover unit 30. The moving member 20 is configured to cover the upper and side surfaces of the guide member 6 and is movable along the guide member 6. Grooves 21 corresponding to the grooves 11 formed in the guide member 6 are formed inside the moving member 20. The rolling elements 12 are provided between the grooves 21 formed in the moving member 20 and the grooves 11 formed in the guide member 6. The rolling elements 12 allow the moving member 20 to smoothly move along the guide member 6 when the substrate stage 4 moves. However, even if the rolling elements 12 cause the moving member 20 to smoothly move along the guide member 6, rubbing between the guide member 6, the moving member 20, and the rolling elements 12 cannot be prevented, and a particle 13 is generated from the rubbing portions. When the generated particle 13 scatters out of the guide apparatus 5 and enters, for example, an exposure apparatus including the guide apparatus 5, pattern defects, yield degradation, and the like occur and impede accurate microfabrication in the exposure apparatus. The moving unit 7 of the driving apparatus 100 according to the first embodiment includes the cover unit 30 to prevent the scatter of the particle 13.

The cover unit 30 includes first cover units 30a located on the side surfaces in the moving direction (±X direction) of the moving member 20 and second cover units 30b located on the side surfaces in a direction (±Y direction) perpendicular to the moving direction of the moving member 20. The first cover units 30a and the second cover units 30b are integrated to surround the side surfaces of the moving member 20 and prevent the scatter of the particle 13 generated between the moving member 20 and the guide member 6. The arrangements of the first cover unit 30a and the second cover unit 30b will be described below with reference to FIGS. 3 and 4.

The first cover unit 30a will be described first with reference to FIG. 3. FIG. 3 is a sectional view of the moving unit 7 of the guide apparatus 5 according to the first embodiment when viewed from a side-surface direction (Y direction) of the guide member 6. Referring to FIG. 3, the right side of the alternate long and short dashed line shows the sectional view on the guide member 6, and the left side of the alternate long and short dashed line shows the sectional view immediately on the near side of the guide member 6. The first cover units 30a are located in a pair on both sides of the moving member 20 in its moving direction (±X direction). The first cover units 30a include a first cover member 31a, a plurality of first plate members 32a, and a plurality of first spacers 34a, which are unitized.

The first cover member 31a includes first portions 35a that protrude from the moving member 20 in its moving direction (±X direction) and face the base 1, and a first connection portion 36a connected to the upper surface of the moving member 20. The first connection portion 36a of the first cover member 31a need only connect the first portions 35a to the moving member 20. Hence, the first connection portion 36a may be configured to be connected to only part of the upper surface of the moving member 20 or connected to the side surface of the moving member 20. If the first portions 35a can directly be connected to the moving member 20, the first cover member 31a may include only the first portions 35a without the first connection portion 36a.

Each first plate member 32a is configured to extend from an end (portion) facing the base 1 via a gap toward the first portion 35a of the first cover member 31a and connect with the first portion 35a. The first plate member 32a has a cutout portion 33 to make the guide member 6 penetrate and thus has a concave shape to surround the upper and side surfaces of the guide member 6. The cutout portion 33 formed in the first plate member 32a is configured to prevent the first plate member 32a from contacting the guide member 6, that is, to form a gap between the first plate member 32a and the guide member 6 when the moving unit 7 moves. A plurality of first plate members 32a are used. The plurality of first plate members 32a are located apart from each other in a direction to separate from the moving member 20, that is, in the moving direction (±X direction) of the moving member 20. Note that if the plurality of first plate members 32a can be fixed to the moving member 20 by the first spacers 34a to be described later, the first cover member 31a need not always be used.

The first spacers 34a are inserted between the plurality of first plate members 32a located apart from each other in the moving direction (±X direction) of the moving member 20 (to be referred to as the gaps between the plurality of first plate members 32a hereinafter). The first spacers 34a have a concave shape open to the base side and maintain the interval between the plurality of first plate members 32a to a predetermined value (pitch p). Note that if the gaps between the plurality of first plate members 32a can be maintained to a predetermined value by the first cover member 31a, the first spacers 34a need not always be used.

The second cover unit 30b will be described next with reference to FIG. 4. FIG. 4 is a sectional view of the moving unit 7 of the guide apparatus 5 according to the first embodiment when viewed from the moving direction (−X direction) of the moving member 20. The second cover units 30b are located in a pair on both sides of the moving member 20 in a direction (±Y direction) perpendicular to the moving direction of the moving member 20. The second cover units 30b include a second cover member 31b, a plurality of second plate members 32b, and a plurality of second spacers 34b, which are unitized. Note that the direction of locating the second cover unit 30b is not limited to the direction (±Y direction) perpendicular to the moving direction of the moving member 20 and need only be a direction different from the moving direction of the moving member 20.

The second cover member 31b includes second portions 35b that protrude from the moving member 20 in the direction (±Y direction) perpendicular to the moving direction of the moving member 20 and face the base 1, and a second connection portion 36b connected to the upper surface of the moving member 20. The second connection portion 36b of the second cover member 31b need only connect the second portions 35b to the moving member 20. Hence, the second connection portion 36b may be configured to be connected to only part of the upper surface of the moving member 20 or connected to the side surface of the moving member 20. If the second portions 35b can directly be connected to the moving member 20, the second cover member 31b may include only the second portions 35b without the second connection portion 36b.

In the cover unit 30 of the first embodiment, the first cover member 31a and the second cover member 31b are formed integrally (that is, by the same member). Hence, the first connection portion 36a and the second connection portion 36b are formed as a common member. However, if the first cover member 31a and the second cover member 31b are formed independently of each other, the first cover member 31a and the second cover member 31b are configured to include the first connection portion 36a and the second connection portion 36b, respectively. In this case, the first connection portion 36a and the second connection portion 36b are independent of each other. The first cover member 31a and the second cover member 31b are connected to the moving member 20 via the first connection portion 36a and the second connection portion 36b, respectively.

Each second plate member 32b is configured to extend from an end (portion) facing the base 1 via a gap toward the second portion 35b of the second cover member 31b and connect with the second portion 35b. A plurality of second plate members 32b are used. The plurality of second plate members 32b are located apart from each other in the direction to separate from the moving member 20, that is, in the direction (±Y direction) perpendicular to the moving direction of the moving member 20. Note that if the plurality of second plate members 32b can be fixed to the moving member 20 by the second spacers 34b to be described later, the second cover member 31b need not always be used.

The second spacers 34b are inserted between the plurality of second plate members 32b located apart from each other in the direction (±Y direction) perpendicular to the moving direction of the moving member 20 (to be referred to as the gaps between the plurality of second plate members 32b hereinafter). The second spacers 34b have a concave shape open to the base side and maintain the interval between the plurality of second plate members 32b to a predetermined value (pitch p). Note that if the gaps between the plurality of second plate members 32b can be maintained to a predetermined value by the second cover member 31b, the second spacers 34b need not always be used.

The first cover unit 30a and the second cover unit 30b having the above-described arrangement can trap the particle 13 that scatters in the ±X direction and ±Y direction. That is, the guide apparatus 5 according to the first embodiment prevents the particle 13 generated between the guide member 6 and the moving member 20 from scattering out of the guide apparatus 5. Note that the first cover unit 30a and the second cover unit 30b may be configured to be detachable from the moving member 20. The first cover unit 30a and the second cover unit 30b may be configured to be detachable from each other.

The effect of the cover unit 30 to prevent the scatter of the particle 13 will be explained with reference to FIGS. 5A and 5B. FIG. 5A is a sectional view showing a state in which the particle 13 generated between the guide member 6 and the moving member 20 scatters out of the second cover unit 30b. If an incident angle θ of the particle 13 satisfies tanθ=2 g/p, the particle 13 scatters out of the second cover unit 30b while being repetitively reflected between the base 1 and the base-side end faces of the plurality of second plate members 32b. In this case, p is the interval (pitch) of the plurality of second plate members 32b, and g is the gap between the base 1 and the base-side end face of the second plate member 32b. However, the particle 13 that satisfies the condition is rarely generated. In most cases, the particle 13 enters a gap 37 between the plurality of second plate members 32b, as shown in FIG. 5B. FIG. 5B is a sectional view showing a state in which the particle 13 generated between the guide member 6 and the moving member 20 enters the gap 37 between the plurality of second plate members 32b. The particle 13 that has entered the gap 37 is repetitively reflected many times by the plurality of second plate members 32b (including the moving member 20) and second spacers 34b. Hence, the kinetic energy of the particle 13 is gradually attenuated. As a result, the particle 13 is trapped by the plurality of second plate members 32b or second spacers 34b and rarely scatters out of the moving unit 7.

To further reduce the scatter of the particle 13 generated between the guide member 6 and the moving member 20 out of the moving unit 7, the gap g between the base 1 and the base-side end face of the second plate member 32b is made smaller. This allows only the particle 13 having the small incident angle θ to pass through the gap g and enables to more effectively prevent the particle 13 from scattering. In addition, the larger the number of second plate members 32b in the second cover unit 30b is, and the larger the outer size of the second plate members 32b is, the larger the effect of preventing the scatter of the particle 13 can be. However, the moving unit 7 becomes bulky. To prevent this, the number and outer size of the plate second plate members 32b are set in consideration of the size of the moving unit 7. In addition, the second cover unit 30b including the second cover member 31b, the plurality of second plate members 32b and second spacers 34b can be unitized as one component by machining or the like. Note that a case in which the particle 13 is generated in the ±Y direction from between the guide member 6 and the moving member 20 has been described with reference to FIGS. 5A and 5B. This also applies to a case in which the particle 13 is generated in the moving direction (±X direction) of the moving member 20. In this case, since the particle 13 is trapped by the first cover unit 30a, the first cover unit 30a is configured like the above-described second cover unit.

As described above, in the guide apparatus 5 according to the first embodiment, the particle 13 generated between the guide member 6 and the moving member 20 can be moved into the cover unit 30 and trapped. Hence, the guide apparatus 5 according to the first embodiment can greatly reduce the scatter of the particle 13 out of the guide apparatus 5.

<Embodiment of Exposure Apparatus>

Figure 6:
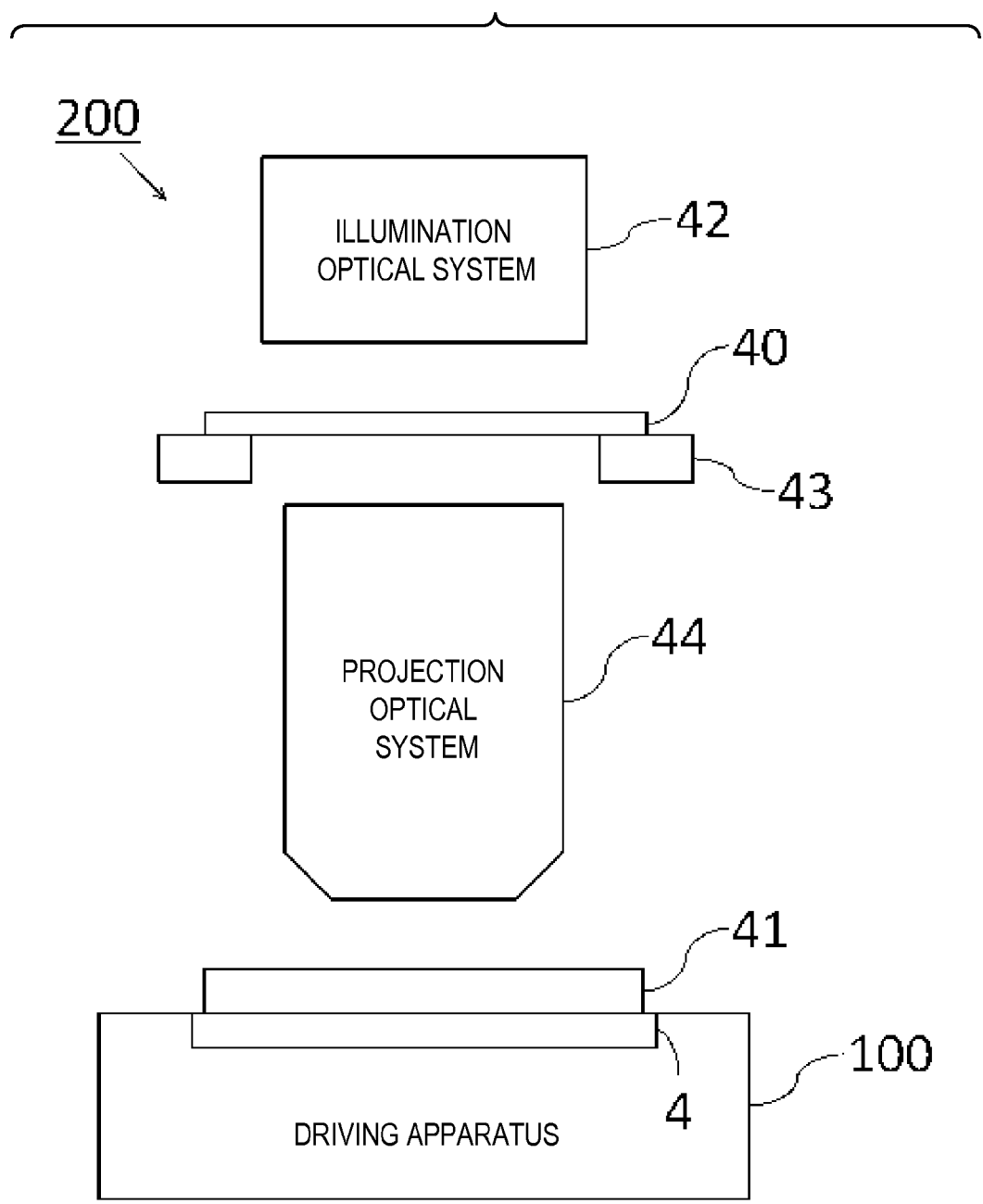
FIG. 6 is a view showing an exposure apparatus according to an embodiment of the present invention.

An exposure apparatus 200 including a guide apparatus according to the embodiment of the present invention will be described with reference to FIG. 6. FIG. 6 is a schematic view showing the arrangement of the exposure apparatus 200 according to the present invention. The exposure apparatus 200 of the present invention is configured to project the pattern of a mask 40 onto a substrate 41 (for example, glass substrate or semiconductor substrate) and expose the substrate. The exposure apparatus 200 includes an illumination optical system 42 that irradiates the mask 40 with light, a mask stage 43 that holds the mask 40, a substrate stage 4 that holds the substrate 41, a projection optical system 44 that projects the pattern of the mask 40 onto the substrate 41, and a driving apparatus 100. The driving apparatus 100 includes a screw member 2, a nut member 3, and a guide apparatus 5 and drives the substrate stage 4. The screw member 2 is supported on a base 1 and rotates about the rotation axis when a motor 8 is driven. The nut member 3 supports the substrate stage 4 and allows it to be driven along the rotation axis of the screw member 2 when the screw member 2 rotates. The guide apparatus 5 includes guide members 6 located on the base 1, and moving members 20 that support the substrate stage 4 and are movable along the guide members 6 as the substrate stage 4 moves. The moving member 20 includes a cover unit 30 that prevents scatter of particles generated from the guide apparatus 5, as in the guide apparatus 5 according to the first embodiment.

In the exposure apparatus 200 having the above-described arrangement, since the guide apparatus 5 included in the driving apparatus 100 includes the cover unit 30, particles generated from the guide apparatus 5 are prevented from scattering. Hence, the exposure apparatus 200 can reduce adhesion of particles to the substrate or the mask at the time of exposure and suppress pattern defects, yield degradation, and the like. In other words, the exposure apparatus 200 can implement accurate microfabrication.

<Embodiment of Method of Manufacturing Article>

A method of manufacturing an article according to an embodiment of the present invention is suitable for manufacturing an article, for example, a micro device such as a semiconductor device or an element having a microstructure. The method of manufacturing an article according to this embodiment includes a step of forming a latent image pattern on a photoresist applied to a substrate using the above-described exposure apparatus (step of exposing a substrate), and a step of developing the substrate on which the latent image pattern has been formed in that step. This method further includes other known steps (oxidation, deposition, evaporation, doping, planarization, etching, resist peeling, dicing, bonding, packaging, and the like). The method of manufacturing an article according to this embodiment is advantageous in at least one of the performance, quality, productivity, and production cost of an article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent arrangements and functions.

This application claims the benefit of Japanese Patent Application No. 2012-093397 filed on Apr. 16, 2012, which is hereby incorporated by reference herein in its entirety.

What is claimed is:

1. A guide apparatus comprising:
a guide member located above a surface of a base;
a movable member movable along longitudinal direction of the guide member; and
a plurality of plate members connected to the movable member,
wherein the plurality of plate members are disposed spaced apart from each other along the longitudinal direction, with a gap therebetween, and each have an end disposed facing the surface of the base, with a gap between the end and the surface of the base, and
wherein the guide member is disposed to not intervene between the ends of the plurality of plate members and the surface of the base.

2. The apparatus according to claim 1, wherein the plurality of plate members include a plurality of first plate members disposed spaced apart from each other in the longitudinal direction.

3. The apparatus according to claim 2, wherein each of the plurality of first plate members includes a cutout portion that is penetrated by the guide member.

4. The apparatus according to claim 1, wherein the plurality of plate members include a plurality of second plate members disposed spaced apart from each other in a direction different from the longitudinal direction and parallel to the base.

5. The apparatus according to claim 1, further comprising:
a cover member including a connection portion connected to the movable member and an elongated portion extending from the connection portion in the direction parallel to the surface of the base,
wherein the plurality of plate members are connected to the movable member via the cover member and arranged between the elongated portion and the base, and are fixed to the elongated portion.

6. The apparatus according to claim 1, further comprising one or more spacers disposed between the plurality of plate members.

7. The apparatus according to claim 6, wherein a gap between the spacers and the base is wider than a gap between the plurality of plate members and the base.

8. The apparatus according to claim 1, wherein the plurality of plate members are made of a single component.

9. The apparatus according to claim 1, wherein:
the plurality of plate members include a plurality of first plate members arranged on sides of the movable member and spaced along the longitudinal direction and a plurality of second plate members arranged on sides of the movable member and spaced along a direction perpendicular to the longitudinal direction, with a gap therebetween, and
the plurality of first plate members and the plurality of second plate members are arranged surrounding side surfaces of the movable member.

10. The apparatus according to claim 1, wherein the movable member includes parts that respectively face the surface of the base, with gaps between the parts and the surface of the base, the parts respectively being arranged at sides of the guide member in a direction perpendicular to the longitudinal direction.

11. The apparatus according to claim 1, wherein each of the plurality of first plate members includes ends respectively arranged at both sides of the guide member in a direction perpendicular to the longitudinal direction.

12. The apparatus according to claim 1, wherein a distance between the surface of the base and the ends is shorter than a distance between a upper surface of the guide member and a lower surface of the guide member.

13. An exposure apparatus for exposing a substrate held on a substrate stage, the exposure apparatus comprising:
a driving apparatus configured to drive the substrate stage,
wherein the driving apparatus includes a screw member supported on a base, a nut member that supports the substrate stage and allows the substrate stage to be driven along a rotation axis of the screw member, and a guide apparatus configured to support the substrate stage and guide a movement of the substrate stage,
wherein the guide apparatus includes:
a guide member located above a surface of the base;
movable member movable along a longitudinal direction of the guide member; and
a plurality of plate members connected to the movable member,
wherein the plurality of plate members are disposed spaced apart from each other along the longitudinal direction, with a gap therebetween, and each have an end disposed facing the surface of the base, with a gap between the end and the surface of the base, and
wherein the guide member is disposed to not intervene between the ends of the plurality of plate members and the surface of the base.

14. A method of manufacturing an article, the method comprising the steps of:
exposing a substrate using an exposure apparatus;
developing the exposed substrate; and
processing the developed substrate to manufacture the article,
wherein the exposure apparatus exposes a substrate held on a substrate stage, and includes:
a driving apparatus configured to drive the substrate stage,
wherein the driving apparatus includes a screw member supported on a base, a nut member that supports the substrate stage and allows the substrate stage to be driven along a rotation axis of the screw member, and a guide apparatus configured to support the substrate stage and guide a movement of the substrate stage, wherein the guide apparatus includes:
- a guide member located above a surface of the base;
- a movable member movable along a longitudinal direction of the guide member; and
- a plurality of plate members connected to the movable member,
- wherein the plurality of plate members are disposed spaced apart from each other along the longitudinal direction, with a gap therebetween, and each have an end disposed facing the surface of the base, with a gap between the end and the surface of the base, and
- wherein the guide member is disposed to not intervene between the ends of the plurality of plate members and the surface of the base.

15. A guide apparatus comprising:
a guide member located above a base; and
a movable member movable along the guide member in a first direction and includes:
- two first side surfaces located perpendicular to the first direction;
- two second side surfaces located perpendicular to a second direction, which is parallel to an upper surface of the base and perpendicular to the first direction;
- a plurality of first plate members arranged to each of the two first side surfaces; and
- a plurality of second plate members arranged to each of the two second side surfaces,
- wherein the plurality of first plate members are disposed parallel to the first side surfaces and disposed spaced along the first direction, and each have an end disposed facing and spaced from the base,
- wherein the plurality of second plate members are disposed parallel to the second side surfaces and disposed spaced in the second direction, and each having an end disposed facing and spaced from the base, and
- wherein the guide member is disposed to not intervene between the ends of the plurality of first and second plate members and the base.

* * * * *